United States Patent
Birtcher et al.

(10) Patent No.: US 6,264,064 B1
(45) Date of Patent: Jul. 24, 2001

(54) CHEMICAL DELIVERY SYSTEM WITH ULTRASONIC FLUID SENSORS

(75) Inventors: Charles Michael Birtcher, Valley Center; Thomas Andrew Steidl, Escondido; Martin Castaneda Martinez, Oceanside; Jamshid Jay Hamidi, Escondido, all of CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 09/418,084

(22) Filed: Oct. 14, 1999

(51) Int. Cl.⁷ ................................................ G01F 11/00
(52) U.S. Cl. ................ 222/1; 222/61; 222/152; 222/189.06; 222/399; 222/481.5
(58) Field of Search .................... 222/1, 58, 61, 222/64, 66, 152, 189.06, 399, 481.5

(56) References Cited

U.S. PATENT DOCUMENTS

| | | | |
|---|---|---|---|
| 5,148,945 | 9/1992 | Geatz | 222/1 |
| 5,156,298 * | 10/1992 | LaRue | 222/66 |
| 5,330,072 | 7/1994 | Ferri et al. | 222/1 |
| 5,417,346 | 5/1995 | Ferri et al. | 222/61 |
| 5,465,766 | 11/1995 | Siegele et al. | 141/198 |
| 5,562,132 | 10/1996 | Siegele et al. | 141/198 |
| 5,568,882 * | 10/1996 | Takacs | 222/64 |
| 5,590,695 | 1/1997 | Siegele et al. | 141/21 |
| 5,607,002 | 3/1997 | Siegele et al. | 141/198 |
| 5,641,006 * | 6/1997 | Autrey et al. | 222/64 |
| 5,663,503 * | 9/1997 | Dam et al. | 73/649 |
| 5,711,354 | 1/1998 | Siegele et al. | 141/198 |
| 5,878,793 | 3/1999 | Siegele et al. | 151/63 |
| 6,039,217 * | 3/2000 | Faulkner, III et al. | 222/152 |
| 6,138,724 * | 10/2000 | Rivera et al. | 222/64 |

* cited by examiner

Primary Examiner—Joseph A. Kaufman
(74) Attorney, Agent, or Firm—Geoffrey L. Chase

(57) ABSTRACT

A chemical delivery system for delivering chemicals having at least a high purity includes at least one first reservoir for containing a fluid and at least one second reservoir for containing the fluid. The system also includes a first conduit, a first fluid sensor, and a controller. The first conduit is for transferring the fluid over time from the at least one first reservoir to the at least one second reservoir. The first conduit is metallic and has a first end in communication with the at least one first reservoir and a second end in communication with the at least one second reservoir. The fluid being transferred from the at least one first reservoir to the at least one second reservoir flows through the first conduit from the first end to the second end. The first fluid sensor is adjacent the first conduit, and the first fluid sensor is adapted to detect a presence of the fluid and to detect an absence of the fluid in the first conduit. The first fluid sensor generates at least one first signal indicative of the presence of the fluid or the absence of the fluid. The controller receives the at least one first signal. The controller is adapted to identify an empty condition in the at least one first reservoir upon receiving the at least one first signal indicative of the absence of the fluid in the first conduit or upon not receiving at least one first signal indicative of the presence of the fluid in the first conduit.

22 Claims, 3 Drawing Sheets

CHEMICAL DELIVERY SYSTEM WITH ULTRASONIC FLUID SENSORS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The present invention relates to chemical delivery systems, and in particular to an apparatus and method for delivering high-purity or ultra-high purity chemicals to a use point, such as a semiconductor fabrication facility or tool(s) for chemical vapor deposition. Although the invention may have other applications, it is particularly applicable in semiconductor fabrication.

Semiconductor manufacturers require chemicals having at least a high-purity for production processes to avoid defects in the fabrication of semiconductor devices. The chemicals used in the fabrication of integrated circuits usually must have an ultra-high purity to allow satisfactory process yields. As integrated circuits have decreased in size, there has been an increase in the need to maintain the purity of source chemicals.

One ultra-high purity chemical used in the fabrication of integrated circuits is tetraethylorthosilicate (TEOS). The chemical formula for TEOS is $(C_2H_5O)_4Si$. TEOS is used widely in integrated circuit manufacturing operations such as chemical vapor deposition (CVD) to form silicon dioxide films.

Integrated circuit fabricators typically require TEOS with 99.999999+%(8–9's+%) purity with respect to trace metals. Overall, the TEOS must have a 99.99+% purity. This high degree of purity is necessary to maintain satisfactory process yields. It also necessitates the use of special equipment to contain and deliver the high-purity or ultra-high purity TEOS to CVD reaction chambers.

High-purity chemicals and ultra-high purity chemicals, such as TEOS, are delivered from a bulk chemical delivery system to a use point, such as a semiconductor fabrication facility or tool(s). A delivery system for high-purity chemicals is disclosed in U.S. Pat. No. 5,465,766 (Seigele, et al.). (Related patents issued to the same inventors and assigned to the same assignee are U.S. Pat. Nos. 5,562,132; 5,590,695; 5,607,002; 5,711,354; and 5,878,793.) The system comprises: a bulk canister located in a remote chemical cabinet with a delivery manifold/purge panel; a refillable stainless steel ampule to supply high-purity source chemicals to an end user; and a control unit to supervise and control the refill operation and to monitor the level of the bulk container. The system has two basic modes of operation: (1) a normal process operation during which high-purity source chemical is supplied to the end user; and (2) the refill mode of operation during which the refillable stainless steel ampule is refilled with high-purity chemical.

The bulk container is continuously pressurized with an inert gas (e.g., helium), which forces the high-purity source chemical from the bulk container through a refill line and to the ampule. A metallic level sensor assembly in the ampule contains a metallic level sensor. The metallic level sensor preferably is a dual level sensor capable of detecting two separate levels of source chemical in the ampule and has two trigger points—a "high level" (full) condition and a "high-high level" condition.

A metallic level sensor assembly for the bulk container comprises a dual level metallic level sensor with trigger points, which provide signals indicating the levels of high-purity chemical in the bulk container. At least one of the trigger points generates a "low level" signal indicative of a level at which the bulk container should be replaced. The sensor is a metallic float level sensor, which includes a metallic float slidably mounted on a metallic shaft. The metallic float rises and falls as the level of high-purity chemical rises above one of the trigger points and drops below one of the trigger points. One of the trigger points is for detecting when the high-purity chemical is near the "empty" level in the bulk container and another trigger point is for detecting when the high-purity chemical is at a "low level" in the bulk container.

It is desirable to determine when the bulk container in such delivery systems is "empty" for several reasons. First, the customer wants to use as much chemical from each container as possible for economical reasons. Second, to avoid any interruption in operations, it is desirable to replace the bulk container as soon as possible after it reaches empty. Also, complete use of the chemical in the bulk container avoids potential problems associated with disposal of chemicals left in the container after it is removed from service.

A weigh scale may be used to determine when the bulk container is approaching "empty." However, the purchase of a weigh scale means additional capital investment. Also, such a method of determining the approach of "empty" usually results in leaving a liquid heel in the container, which is not desirable.

Metallic float sensor assemblies, such as in the patents issued to Seigele, et al., are known sources of metallic particles, which are contaminants in the electronics industry. Sliding metal-to-metal contact causes the shedding of metal particles and dissolution of metal ions, thus contaminating the high-purity TEOS or other high-purity source chemical in the delivery systems. In addition to being generators of contaminants, float level sensors do not operate well in chemicals having relatively high viscosities (e.g., tantalum pentaethoxide, TAETO).

There are various other types of level sensors used for detection of an "empty" or "approaching empty" condition. The different types of sensors include optical, reed/float, capacitance, differential pressure, and load cells/strain gauges. There are disadvantages associated with each of these types of sensors. For example, differential pressure and load cells/strain gauges only detect down to about 3% to 5% level. Optical, reed/float, and capacitance sensors require a probe, a potential source of contaminants, to be inserted in the chemical supply, and these sensors also typically detect only down to about 3% to 5% level. The use of a probe also requires elastomeric seals or metal seals, both of which may leak.

Capacitance level sensors also are subject to interference from outside signals and "noise", such as that from radio frequency induction (RFI) and electromagnetic induction (EMI), both of which are common in semiconductor fabrication facilities.

Another attempt to enable 100% chemical usage from bulk containers has involved installation of a well in the bottom of the container and placement of a dip tube and level sensor in the well. Such containers are more expensive, are harder to clean, require additional height, and still do not enable 100% usage of the chemical.

The use of optical liquid sensors to detect liquid in teflon tubing is well known in the art of chemical delivery systems. For example, in a system for delivering a liquid chemical for cleaning semiconductor wafers, such as sulfuric acid ($H_2SO_4$), optical liquid sensors may be used for liquid level detection in a pressure vessel and also for liquid flow detection in teflon tubing throughout the system.

Such a delivery system may include a supply of liquid chemical in a drum connected by a teflon tube to a pump for pumping the liquid chemical from the drum through lines and filters to a fabrication facility or other end use. An optical liquid flow sensor on the teflon tube is commonly used to prevent cavitation and/or dry runs that could damage the pump. The optical sensor activates an electronic switch which shuts the pump off when no liquid is flowing in the line, a condition typically indicated first by a breakup in liquid flow when the drum level approaches empty.

Such systems and detection methods are not suitable for delivering high-purity and ultra-high purity chemicals used in integrated circuit manufacturing operations such as CVD to form silicon dioxide films. These types of applications cannot use the teflon tubing/optical sensor method of detecting liquid fluid because of the sensitivity of the high-purity and ultra-high purity chemicals to atmospheric contamination (e.g., $O_2$ and $H_2O$) that would diffuse into the system. To avoid such contamination, stainless steel systems typically are used.

In addition, delivery systems using in-line pumps generally are unacceptable for high-purity and/or ultra-high purity chemicals because the pumps are a source of contamination and often have maintenance problems. For those and other reasons, chemical delivery systems which operate without in-line pumps have been designed. For example, U.S. Pat. No. 5,148,945 (Geatz) ("the '945 patent") discloses an apparatus and method for the transfer and delivery of high-purity chemicals using a combination of vacuum and pressure transfer from a bulk source through one or more intermediate pressure/vacuum vessels to one or more end-use stations. The use of multiple vessels allows simultaneous delivery of chemical to the end-users and refilling of the vessels.

Each of the vessels is equipped with a level sensor, preferably a capacitive-type level sensor, for monitoring fluid level in the vessel. Means are provided to switch between delivery vessels to maintain a continuous supply to a delivery conduit when a supplying delivery vessel "approaches" empty (rather than reaches empty). However, the '945 patent does not teach a method or means for substantially complete utilization of the chemical in one vessel (i.e., for obtaining an "empty" condition) before switching over to another vessel.

The '945 patent discloses the use of an optional flow control on the delivery conduit to control the flow rate to the end users The flow control includes a flow sensor, which may be an ultrasonic flow sensor. However, the flow sensor is not used to determine fluid level in any of the vessels of the system. Rather, fluid levels in the vessels are determined by level sensors, preferably capacitive-type level sensors.

Two related patents assigned to the same assignee, U.S. Pat. No. 5,330,072 (Ferri Jr., et al.) and U.S. Pat. No. 5,417,346 (Ferri Jr. , et al.), teach improvements of the process and apparatus disclosed in the '945 patent, the improved process and apparatus being electronically controlled. As before, level sensors (preferably capacitive-type sensors) are used to monitor liquid level in the pressure/vacuum vessels. When a vessel "approaches" empty, a signal is provided from a "low" level sensor and another vessel is brought on-line so that flow continues without interruption. The near-empty vessel is then refilled. Flow from the first vessel is shut down to prevent it from "over-emptying".

It is desired to have a more reliable method of detecting an "empty" condition in a bulk reservoir of a chemical delivery system for high-purity or ultra-high purity chemicals.

It is further desired to have a more reliable method of delivering a high-purity or ultra-high purity chemical from a bulk chemical delivery system to a use point.

It is still further desired to have an apparatus and a method which deliver high-purity or ultra-high purity chemicals which minimize chemical waste and disposal costs.

It is still further desired to have a method of delivering high-purity or ultra-high-purity chemicals which has a lower cost for abatement.

It is still further desired to have an apparatus and method for delivering high-purity or ultra-high purity chemicals which overcome the difficulties and disadvantages of the prior art to provide better and more advantageous results.

It is still further desired to have a chemical delivery system for delivering high-purity or ultra-high purity chemicals which does not require the use of level sensors on or within the containers/reservoirs of the system.

It also is desired to have an improved apparatus and method to deliver high-purity or ultra-high purity chemicals to semiconductor manufacturing processes using an operationally safe, cost-effective, bulk chemical delivery system.

BRIEF SUMMARY OF THE INVENTION

The present invention is a chemical delivery system for delivering chemicals having at least a high purity. The invention also includes a method of detecting an occurrence of an "empty condition" in a reservoir containing a liquid, said liquid having at least a high-purity and flowing over time from said reservoir through a metallic conduit in communication with the reservoir, said reservoir having a headspace pressurized by a gas above the liquid. (The term "empty condition" as used herein means a condition where there has been substantially complete utilization of the liquid in the reservoir.)

In a first embodiment, the chemical delivery system includes at least one first reservoir for containing a fluid and at least one second reservoir for containing the fluid. The chemical delivery system also includes a first conduit, a first fluid sensor, and a controller. The first conduit is for transferring the fluid over time from the at least one first reservoir to the at least one second reservoir. The first conduit is metallic and has a first end in communication with the at least one first reservoir and a second end in communication with the at least one second reservoir. The fluid being transferred from the at least one first reservoir to the at least one second reservoir flows through the first conduit from the first end to the second end. The first fluid sensor is adjacent the first conduit. The first fluid sensor is adapted to detect a presence of the fluid in the first conduit and to detect an absence of the fluid in the first conduit. The first fluid sensor generates at least one first signal indicative of the presence of the fluid or the absence of the fluid. The controller receives the at least one first signal. The controller is adapted to identify an empty condition in the at least one first reservoir upon receiving at least one first signal indicative of the absence of the fluid in the first conduit or upon not receiving at least one first signal indicative of the presence of the fluid in the first conduit.

Preferably, the first fluid sensor is an ultrasonic fluid sensor. The fluid sensor may be adjacent the first end of the first conduit.

The controller may be a microcomputer, a microprocessor or some other type of controller.

A second embodiment of the chemical delivery system also includes means for removing at least a portion of the fluid from the at least one second reservoir.

The chemical delivery system may be used in various applications with various fluids, but has particular application for liquid chemicals that have at least a high purity. For example, the liquid chemical may be selected from the group consisting of tetraethylorthosilicate (TEOS), borazine, aluminum trisec-butoxide, carbon tetrachloride, trichloroethanes, chloroform, trimethylphosphite, dichloroethylenes, trimethylborate, dichloromethane, titanium n-butoxide, diethylsilane, hexafluoroacetylacetonato-copper(1)trimethylvinylsilane, isopropoxide, triethylphoshate, silicon tetrachloride, tantalum ethoxide, tetrakis(diethylamido)titanium, tetrakis(dimethylamido)titanium, bis-tertiarybutylamido silane, triethylborate, titanium tetrachloride, trimethylphosphate, trimethylorthosilicate, titanium ethoxide, tetramethyl-cyclotetrasiloxane, titanium n-propoxide, tris(trimethylsiloxy) boron, titanium isobutoxide, tris(trimethylsilyl)phosphate, 1,1,1,5,5,5-hexafluoro-2,4-pentanedione, tetramethylsilane and mixtures thereof.

In a third embodiment, the fluid is a liquid chemical and the system is similar to that of the first embodiment, except that it includes the following: means for pressurizing with a gas a first headspace above the liquid chemical within the at least one first reservoir; and means for pressurizing with a gas a second headspace above the liquid chemical within the at least one second reservoir. The gas used to pressurize the first and second headspaces may be selected from a group of gases, including but not limited to helium, nitrogen and argon.

A fourth embodiment is similar to the third embodiment but includes a vent for venting the gas from the first headspace and/or the second headspace. In one variation of the fourth embodiment, the vent includes: a second conduit for exhausting at least a portion of the gas being vented; and a second fluid sensor adapted to detect a presence of the liquid chemical in the second conduit, wherein the second fluid sensor generates at least one second signal indicative of the presence of the liquid chemical in the second conduit. In this variation, the controller preferably receives the at least one second signal, the controller being adapted to identify an overflow of the liquid chemical from the at least one first reservoir and/or from the at least one second reservoir upon receiving the at least one second signal.

A fifth embodiment of the invention is similar to the third embodiment, but includes a source of vacuum for evacuating a portion of any non-liquids in the at least one first reservoir and/or in the at least one second reservoir. In one variation of the fifth embodiment, the source of vacuum includes: a third conduit for exhausting said non-liquids; and a third fluid sensor adapted to detect a presence of the liquid chemical in the third conduit, wherein the third fluid sensor generates at least one third signal indicative of the presence of the liquid chemical in the third conduit. In this variation, the controller preferably receives the at least one third signal, the controller being adapted to identify a malfunction in the chemical delivery system upon receiving the at least one third signal.

There is yet another embodiment of the chemical delivery system for delivering liquid chemical having at least a high purity. This embodiment includes at least one first reservoir for containing the liquid chemical, at least one second reservoir for containing the liquid chemical, and means for removing at least a portion of the liquid chemical from the at least one second reservoir. Also included is a first conduit and a first ultrasonic sensor adjacent the first conduit. The first conduit is for transferring the liquid over time from the at least one first reservoir to the at least one second reservoir. The first conduit is metallic and has a first end in communication with the at least one first reservoir and a second end in communication with the at least one second reservoir. The liquid chemical being transferred from the at least one first reservoir to the at least one second reservoir flows through the first conduit from the first end to the second. The first ultrasonic fluid sensor is adapted to detect a presence of the liquid chemical and to detect an absence of the liquid chemical. The first ultrasonic fluid sensor generates at least one first signal indicative of the presence of the liquid chemical or the absence of the liquid chemical. This embodiment also includes: means for pressurizing with a gas a first headspace above the liquid chemical within the at least one first reservoir; and means for pressurizing with a gas a second headspace above the liquid chemical within the at least one second reservoir. The embodiment also includes a second conduit and a second ultrasonic fluid sensor. The second conduit is for venting at least a portion of the gas from the first headspace and/or from the second headspace. The second ultrasonic fluid sensor is adapted to detect a presence of the liquid chemical in the second conduit. The second ultrasonic fluid sensor generates at least one second signal indicative of the presence of the liquid chemical in the second conduit. This embodiment also includes a third conduit and a third ultrasonic fluid sensor. The third conduit is for evacuating at least a portion of any non-liquids in the at least one first reservoir and/or in the at least one second reservoir. The third ultrasonic fluid sensor is adapted to detect a presence of the liquid chemical in the third conduit. The third ultrasonic fluid sensor generates at least one third signal indicative of the presence of the liquid chemical in the third conduit. Finally, this embodiment includes a controller for receiving the at least one first signal, the at least one second signal, and the at least one third signal. The controller is adapted to identify an empty condition in the at least one first reservoir upon receiving the at least one first signal indicative of the absence of the liquid chemical in the first conduit or upon not receiving the at least one first signal indicative of the presence of the liquid chemical in the conduit. The controller also is adapted to identify an overflow of the liquid chemical from the at least one first reservoir and/or from the at least one second reservoir upon receiving the at least one second signal. In addition, the controller is adapted to identify a malfunction in the chemical delivery system upon receiving the at least one third signal.

The chemical delivery system is shut down when the controller identifies any one of the following: (a) an overflow of the liquid chemical from the at least one first reservoir and/or from the at least one second reservoir; and (b) a malfunction in the chemical delivery system.

Another aspect of the present invention is a method of detecting an occurrence of an empty condition in a reservoir containing a liquid, said liquid having at least a high-purity. In a first embodiment of this method, the liquid flows over time from the reservoir to a metallic conduit in communication with the reservoir, said reservoir having a headspace pressurized by a gas above the liquid. The method includes multiple steps. The first step is to provide a fluid sensor adjacent the metallic conduit, said fluid sensor adapted to detect a presence of the liquid in the metallic conduit and to transmit at least one first signal indicative thereof. The fluid sensor also is adapted to detect a presence of the gas in the metallic conduit and to transmit at least one another signal indicative thereof. The second step is to detect with the fluid sensor a presence of the liquid in the metallic conduit, the fluid sensor transmitting said at least one first signal. The third step is to identify with the fluid sensor a subsequent absence of the liquid in the metallic conduit. Preferably the fluid sensor is an ultrasonic fluid sensor.

In one variation of the first embodiment of the method of detecting an occurrence of an empty condition, the step of identifying with the fluid sensor a subsequent absence of said liquid in the metallic conduit comprises two sub-steps. The first sub-step is to receive the at least one first signal from the fluid sensor. The second sub-step is to identify a subsequent absence of the at least one first signal from the fluid sensor.

A second embodiment of the method is similar to the first embodiment of the method, but includes several additional steps. The first additional step is to wait a predetermined period of time (e.g., about 2 seconds) after identifying the subsequent absence of the liquid. The second additional step is to sense with the fluid sensor a subsequent presence of a fluid in the metallic conduit. The third additional step is to determine with the fluid sensor whether the fluid is the liquid or the gas. The fourth additional step is to repeat the second and third steps, as well as the first, second and third additional steps, if the fluid is the fluid is determined to be the liquid. If the fluid is determined to be the gas, the final additional step is to transmit at least one another signal from the fluid sensor, said another signal indicating an occurrence of an empty condition in the reservoir.

DETAILED DESCRIPTION OF THE INVENTION

The present invention is a chemical delivery system which is especially useful for delivering high-purity or ultra-high purity chemicals for, inter alia, semiconductor processing. Semiconductor processes require increasingly larger quantities of ultra-pure chemicals due to more stringent purity requirements for processing wafers of larger diameters. Ultra-high purity chemicals typically have less than one part per billion (ppb) by volume of contaminants, such as metals and the like.

The term "chemical" as used herein is intended to include any form of liquid, and should be understood to include pure or mixed chemicals, as well as liquids with substances suspended therein.

Included in the chemical delivery system of the present invention is a highly reliable, clean, non-intrusive means for detecting when a bulk reservoir reaches "empty" or "overfill", as well as when liquid chemicals are in areas of the system (e.g., vent lines or vacuum lines) where liquids should not be present. This means for detecting includes the use of ultrasonic fluid sensors which, in the preferred embodiment, clamp on the lines in the system to sense liquid in the lines. This provides a method of detection which enables the user to consume essentially all of the available liquid chemical in the bulk reservoir, resulting in significant savings to the user and reduction in or elimination of disposal costs associated with returned chemicals.

Although different types of ultrasonic sensors may be used for the fluid sensors in the present invention, one such sensor is available from Cosense, Inc. of Hauppauge, N.Y. For example, the non-invasive ultrasonic sensor described in U.S. Pat. No. 5,663,503 is similar to the type of sensor used in the present invention. Although such sensors typically are used for measuring the level of a liquid in a vessel, the ultrasonic sensors in the present invention are used to detect the presence of fluid in conduits or process lines.

The ultrasonic sensor includes an element for transmitting and receiving ultrasonic energy. It usually is bonded by an adhesive to an exterior wall of a vessel or pipe, wherein the interior wall of the vessel or pipe has an interface with a fluid.

The chemical delivery system of the present invention is primarily a stainless steel system compatible with chemicals used in chemical vapor deposition (CVD) processes, such as TEOS. The system provides a safe, clean, and efficient method of supplying a chemical to process tools. The system automatically supplies the chemical to multiple tools, automatically monitors the chemical fill level of two reservoirs in the system, and notifies an operator when the reservoirs are low or empty and when there is an overfill condition or malfunction in the system.

Figure 1:
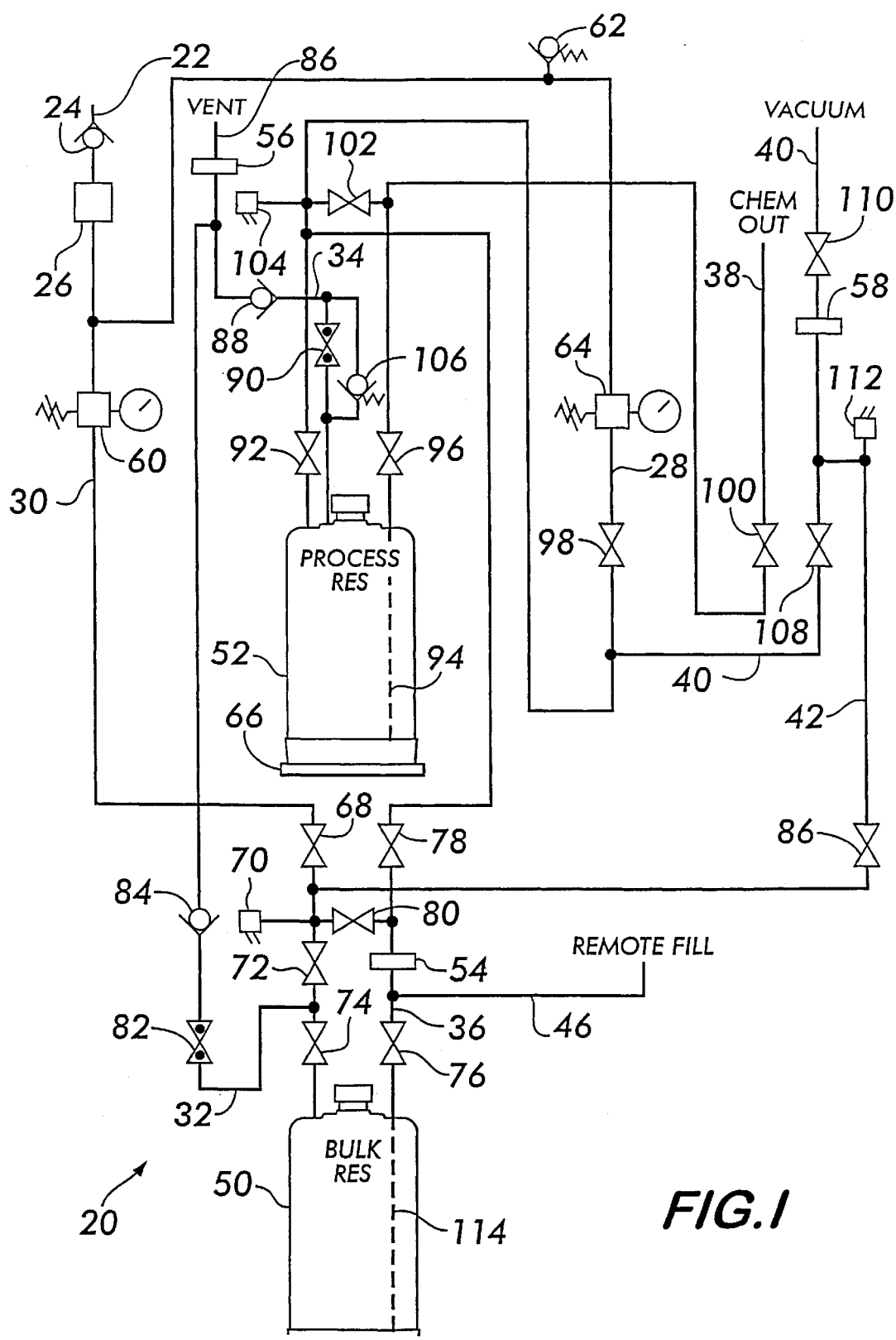
FIG. 1 is a process flow diagram illustrating one embodiment of the present invention.

A preferred embodiment of the invention is illustrated in FIG. 1. While the system 20 is described with reference to high-purity TEOS (tetraethylorthosilicate), the system also may be used with many other high-purity source chemicals, as persons skilled in the art will recognize. Other chemicals which may be used include, but are not limited to, those listed in Table 1.

TABLE 1

| | |
|---|---|
| Aluminum Tri-sec-Butoxide | Borazine |
| Carbon Tetrachloride | Trichloroethane |
| Chloroform | Tetraethylorthosilicate |
| Dichloroethylene | Triethylborate |
| Dichloromethane | Titanium iso-butoxide |
| Diethylsilane | Titanium n-propoxide |
| Hexafluoroacetylacetonate-Copper(I)-Tri-methylvinylsilane | Isopropoxide |
| Silicon Tetrachloride | Tantalum Ethoxide |
| Tetrakis (Diethylamino) Titanium | Trimethylborate |
| Trimethylphosphite | Triethylphosphate |
| Titanium Tetrachloride | Trimethylphosphate |
| Trimethylorthosilicate | Titanium Ethoxide |
| Tetramethyl-cyclo-tetrasiloxane | Titanium n-propoxide |
| Tris (Trimethylsiloxy) Boron | Tetramethylsilane |
| Bis-tertiarybutylamidosilane | 1,1,1,5,5,5-hexafluoro-2,4-pentanedione |
| Tris (Trimethylsilyl) Phosphate | Tetrakis(dimethylamido) titanium |

Figure 2:
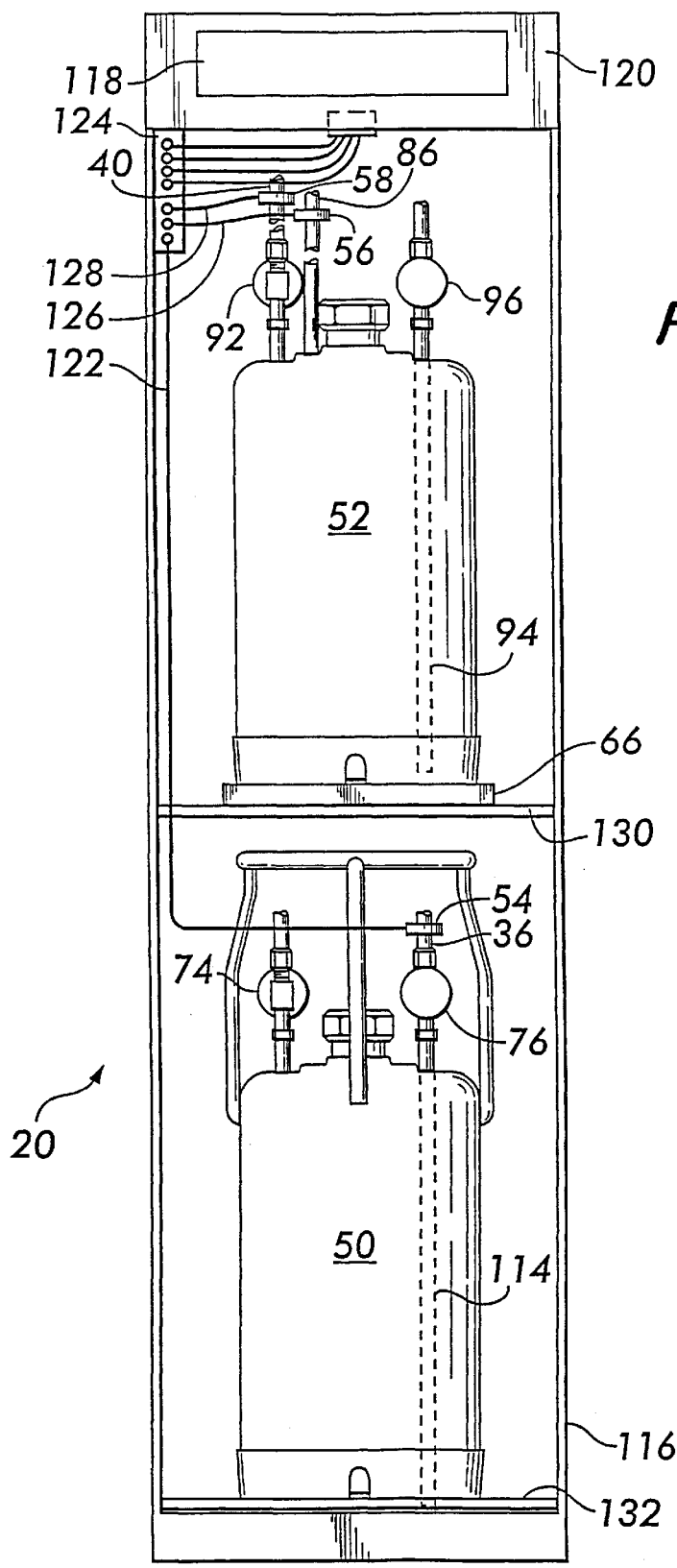
FIG. 2 is a schematic illustration of one embodiment of the invention.

Referring to FIG. 1 and FIG. 2, two reservoirs—a bulk reservoir 50 and a process reservoir 52—contain a liquid chemical to be delivered to an end user (not shown). In the preferred embodiment, the two reservoirs are vertically spaced apart in a cabinet 116. However, the relative positions of the two reservoirs is not critical, and many other arrangements are possible. Also, in alternate embodiments there may be multiple bulk reservoirs and/or multiple process reservoirs.

Referring again to FIG. 1 and FIG. 2, the process reservoir 52 rests on a weigh scale 66 on an upper shelf 130 inside the cabinet 116 and the bulk reservoir 50 rests on a lower shelf 132 inside the cabinet. The weight of the chemical in the process reservoir is monitored continuously by the scale. If the actual weight, which may be displayed as a percentage of the full weight, falls below a "low setpoint," an alarm is activated. During normal operations, when the weight falls by a predetermined amount (e.g., 2%), refill is delivered from the bulk reservoir to the process reservoir.

At any given time, depending on the operation performed, one or both of the reservoir containers (50, 52) may be full, partially full, or empty. Typically, a sufficient supply (e.g., one-day supply) is provided in the process reservoir 52 to allow for change out of the bulk reservoir 50 after the bulk reservoir runs dry (i.e., after there has been a substantially complete utilization of the chemical in the bulk reservoir).

Liquid chemical may be delivered to a process tool(s) or other end user(s) from the process reservoir 52 via chemical delivery line 38, which is a stainless steel, electro-polished line in the preferred embodiment. Flow in the chemical delivery line may be regulated by various valves, such as valves 96 and 100, as shown in FIG. 1. The rate of flow also may be regulated by regulator 64 and valves 92 and 98, which are involved in pressurization of the headspace in the process reservoir, as discussed below.

Valves 92 and 96 on the process reservoir 52 may be controlled manually or pneumatically, as is the case with valves 74 and 76 on bulk reservoir 50. In the preferred embodiment, all other valves in the system are pneumatically controlled.

In the preferred embodiment, the chemical delivery line 38 is a coaxial line with a lockable shutoff valve (not shown). The chemical delivery line is connected to a chemical output manifold (not shown), which may or may not be connected to a degasser (not shown). The liquid chemical passes from the process reservoir 52 through the degasser and the chemical output manifold, and is then directed to the input for the process tool(s) (not shown).

A chemical refill line 46 allows the bulk reservoir 50 to be filled from an external source (not shown).

The liquid chemicals are "pushed" through the system with an ultra-high purity gas, such as helium, oxygen, hydrogen. (Other inert gases such as nitrogen, argon, etc. may be used, as well as any gas which does not react with the liquid chemicals, the chemical application, or the materials of the system.) The gas is used to pressurize the headspace of the bulk reservoir 50 and the headspace of the process reservoir 52.

Referring to FIG. 1, the gas enters line 22, passes through check valve 24 and filter 26 before entering line 30 to the bulk reservoir 50 and line 28 to the process reservoir 52. The flow of the gas through line 30 is regulated by pressure regulator 60 and various valves (68, 72, and 74). Pressure sensor 70 provides an operator with an indication of the gas pressure in line 30.

The flow of the gas through line 28 to reservoir 52 is regulated by pressure regulator 64 and various valves (92 and 98). Pressure relief valve 62 is a safety relief valve provided to relieve excess pressure in the gas lines. Pressure sensor 104 provides an operator with a reading of the gas pressure in line 28.

In addition to pressurizing the headspace of bulk reservoir 50 and maintaining it at a desired pressure, the gas pushes liquid chemical from the bottom of the bulk reservoir upward through dip tube 114 through line 36 and valves 78 and 92 (via a portion of line 28) to process reservoir 52. While liquid is flowing through a portion of line 28 (during this "fill" operation) valve 98 is kept closed. The flow of chemical liquid in line 36 may be regulated by valve 76 and valve 78, and the flow of the chemical liquid into process reservoir 52 may be regulated by valve 92.

Similarly, in addition to pressurizing the headspace of process reservoir 52 and maintaining it at a desirable pressure, the inert gas pushes chemical liquid from the bottom of process reservoir 52 upward through dip tube 94 to chemical delivery line 38.

Fluid sensor 54 detects the presence of fluid flowing from bulk reservoir 50 through line 36, as well as the presence of static fluid in that line when the process reservoir 52 is not being filled. In the preferred embodiment, the fluid sensor is an ultrasonic fluid sensor clamped on the exterior of stainless steel line 36. The fluid sensor may detect the presence and/or absence of fluid in line 36. When detecting a presence of fluid in the line, the fluid sensor further determines whether the fluid is a liquid or a gas, and transmits a corresponding signal indicative of either a liquid or a gas.

Under normal operations, when the fluid sensor 54 detects an absence of liquid, this indicates that there has been a substantially complete utilization of the available chemical liquid previously present in bulk reservoir 50, meaning that the bulk reservoir is now "empty" (i.e., this is an "empty condition"). This alerts the operator that it is time to replace the bulk reservoir container with another bulk reservoir container containing a fresh supply of the chemical liquid.

Figure 3:
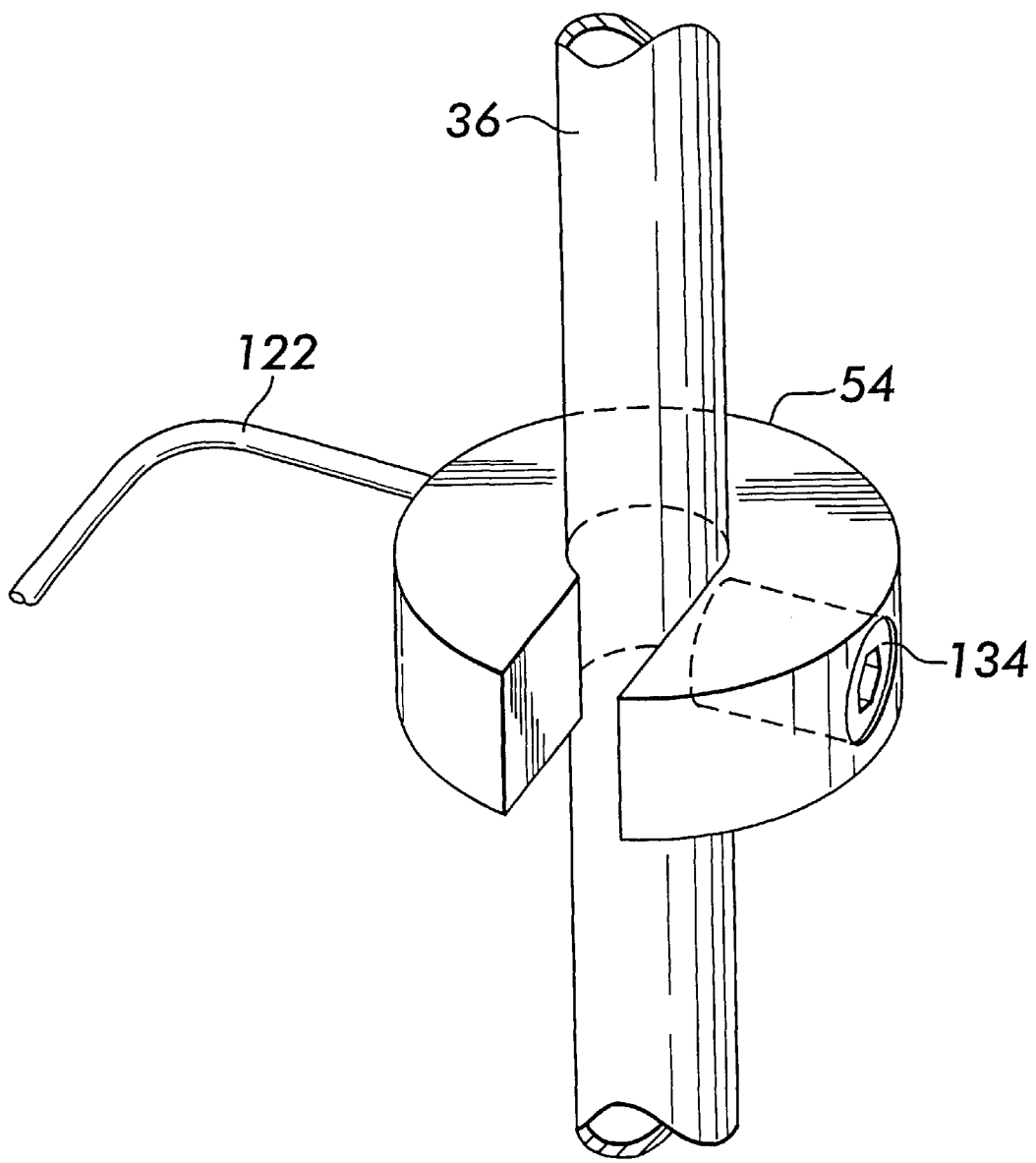
FIG. 3 is a perspective view of a clamp-on ultrasonic sensor of the type used in the present invention clamped on a line.

Sensor 54 preferably is an ultrasonic fluid sensor which is clamped on line 36 as shown in FIG. 3. The clamp-on ultrasonic fluid sensors used in the preferred embodiment are easy to install. Each clamp-on sensor has a self-check to verify that the sensor is properly installed. When clamped to a metallic line, the ultrasonic signal transmitted from the sensor is changed in a way that can be detected, which enables verification that the sensor has been installed correctly on the line. This change in signal is different from a change indicating the presence or absence of liquid.

Referring to FIG. 2, the system 20 is controlled with a microcomputer 118 (or another type of controller) and a programmable operating system, which monitors all key parameters and automatically controls most maintenance functions. For example, a cycle purge operation and a leak check operation are automated functions designed into the "change reservoir" operation. This automation reduces the time and effort involved in performing common maintenance tasks. The automated system also provides zero downtime for normal operations, since it permits replacement of the bulk reservoir 50 while the process reservoir 52 is in process and providing chemical to the process tool(s).

The microcomputer 118 is enclosed in electronic enclosure 120 mounted on top of cabinet 116. A shielded coaxial cable 122 connects flow sensor 54 to a printed circuit assembly (PCA) 124 mounted in a shielded enclosure (not shown).

As previously discussed, fluid sensor 54 generates a signal indicative of the presence or the absence of fluid in line 36. This signal is fed to the PCA 124 by coaxial cable 122 and a signal is then fed from the PCA to the microcomputer 118. The microcomputer identifies an "empty" condition in the bulk reservoir 50 upon receiving a signal indicative of the absence of liquid or upon not receiving a signal indicative of the presence of liquid. Upon determining an "empty" condition, the microcomputer alerts an operator via an alarm (e.g., an audible or visual alarm, a computer-generated report, or any combination of these or other types of alarms).

In a preferred embodiment, a short "delay" (e.g., a two-second delay) is programmed into the operation to account for the possibility of "false readings" from gas bubbles in line 36. This allows time to verify that the "no flow" signal from fluid sensor 54 is not due to a gas bubble in the line (e.g., a bubble of helium, air, or other gas).

As previously discussed, in one embodiment, fluid sensor 54 not only detects the presence of fluid, but also determines whether the fluid is a liquid or a gas, and then generates a signal indicative of a liquid or of a gas. (If a gas is present, the signal is different than if a liquid is present.) That signal is transmitted via coaxial cable 122 to PCA 124, and from there a signal is transmitted to the microcomputer 118.

The system 20 also includes means for venting some of the inert gas from the bulk reservoir 50 and the process reservoir 52 in order to maintain a system pressure compatible with the desired pressure at the end user. Vent line 86 is connected to an appropriate abatement system (not shown).

Gas vented from bulk reservoir 50 is transmitted to vent line 86 via line 32, and may be regulated by check valve 84 and valve 82, which normally is open, as indicated by the darkened circular symbols inside valve 82 in FIG. 1. (Alternatively, the system could be designed so that valve 82 normally is closed, if so desired.) Similarly, gas vented from process reservoir 52 is transmitted to vent line 86 via line 34, and may be regulated by pressure relief vale 106 and check valve 88.

Valve 90, which normally is open, vents process reservoir 52 to line 34 at a location between check valve 88 and valve 90. (Alternatively, the system could be designed so that valve 90 normally is closed, if so desired.) Also, valve 90 is pulsed open for about 0.5 seconds to vent the gas in process reservoir 52 when the gas pressure reaches a predetermined value during the fill of the process reservoir from the bulk reservoir 50, so as to prevent over pressurization of the process reservoir.

Overflow sensor 56, which preferably is an ultrasonic fluid sensor, is similar to fluid sensor 54. Since any material in vent line 86 should be gaseous and not liquid, if overflow sensor 56 detects liquid in the vent line, the overflow sensor sends a signal via coaxial cable 126 to PCA 124, which in turn transmits a signal to microcomputer 118, as shown in FIG. 2. Upon receipt of such a signal, the microcomputer immediately closes all open valves and shuts down the system 20, since the presence of liquid in vent line 86 indicates a possible "overfull condition" or "overflow condition" in bulk reservoir 50 or process reservoir 52. The microcomputer may then alert an operator of this condition via an alarm. The alarm may be an audible warning, a light or other visual warning, a report on a computer system, or any combination of these or other types of alarms.

When the bulk reservoir 50 and/or the process reservoir 52 are to be disconnected, it is desirable to remove any gases from the reservoir connectors. For this purpose, a vacuum means is provided as part of the system 20. Vacuum line 40 is connected to a vacuum source (not shown) to ensure complete removal of chemical vapors and atmospheric gases that invariably enter the lines of the system during the reservoir change operation. Vacuum line 40 may be regulated by valve 110. Crossover valves 80 and 102 allow for use of the vacuum means both on the gas side and on the liquid side of the reservoir.

Chemical vapors and atmospheric gases, as well as residual liquids, may be evacuated from the lines, valves, and output manifold (not shown) attached to process reservoir 52 via line 40, which may be regulated by valve 108. Similarly, vapors and atmospheric gases may be evacuated from bulk reservoir 50 via line 42, which may be regulated by valve 85. Pressure sensor 112 senses vacuum pressure in line 42 and provides an operator with a reading indicative thereof.

During normal operations, there should be no liquid in vacuum line 40. However, in the case of an overflow condition or other malfunction (e.g., a valve failure) which could result in a hazardous condition, any liquid in this line would be detected by liquid sensor 58, which in the preferred embodiment is an ultrasonic fluid sensor (similar to sensors 54 and 56). If this fluid sensor does detect a presence of liquid, it generates a signal indicative thereof, which signal is transmitted via coaxial cable 128 to PCA 124, which transmits a signal to microcomputer 118, as shown in FIG. 2. Upon receipt of such a signal, the microcomputer immediately closes all open valves and shuts down the system 20. The microcomputer 118 then alerts an operator of this condition/malfunction via an alarm. The alarm may be an audible warning, a light or other visual warning, a report on a computer system, or any combination of these or other types of alarms.

An optional feature of the system 20 is a purge feature, which is not shown in the figures. If the system include s this feature, semi conductor-grade nitrogen or another appropriate inert gas may be used to purge the output manifold to the process tool(s), the degasser, or the line 38 back to process reservoir 52.

FIG. 3 illustrates a clamp-on ultrasonic fluid sensor 54 mounted on line 36. As shown in FIG. 3, the structure of the sensor includes a slot for clamping the sensor over the line or conduit, and the sensor is held in place on the line by a screw 134 or other type of fastener.

The microcomputer 118 monitors the signals generated by the clamp-on sensors (54, 56, 58) to ensure that the sensor s are properly installed and not removed from the lines or conduits (36, 86, 40). If the feedback from a sensor is not proper, this indicates possible sensor failure, and the microcomputer places the system in a fail-safe mode. In this mode, the valves are closed (safely isolating the chemical) and are not allowed to open until the "sensor failure" condition is cleared.

Persons skilled in the art will recognize that the present invention provides numerous advantages over the prior art. This use of fluid sensors (preferably ultrasonic fluid sensors) enables the user to consume substantially all of the available chemical in the bulk reservoir, and reduces the costs of disposal or abatement of high-purity and ultra-high purity chemicals, such as those used in the electronics industry. Since essentially none of the available chemical is lost by the user with the present invention, whereas losses of 2%–5% are not uncommon for prior art systems, the savings resulting from the present invention are substantial.

The present invention uses ultrasonic fluid sensors in a way that eliminates the need for level sensors on the containers or reservoirs such as those in the prior art. This avoids or eliminates the many problems associated with such level sensors. However, although it is preferable to use containers or reservoirs, such as bulk reservoir 50, without any level sensors as taught by the present invention, the use of ultrasonic fluid sensors (as in this invention) permits end users to use existing containers which do have prior art level sensors attached to or incorporated within the containers.

While the present invention primarily is directed to the delivery of chemicals used in industries where the chemicals must be maintained at a relatively high purity (i.e., submicron semiconductor manufacturing), and especially to the delivery of chemicals used in the production of wafers in the semi-conductor industry and for similar processes, the present invention is not so limited. It will be appreciated by persons skilled in the art that the present invention also may be applied to the delivery of chemicals in virtually any industry, and particularly to the delivery of chemicals that must be maintained at a level of high-purity or ultra-high purity.

Although illustrated and described herein with reference to certain specific embodiments, the present invention nevertheless is not intended to be limited to the details shown. Rather, various modifications may be made in the details within the scope and range of equivalence of the claims and without departing from the spirit of the invention.

What is claimed is:

1. A chemical delivery system for delivering chemicals having at least a high purity adapted for semiconductor processing, comprising:
   at least one first reservoir for containing a fluid, adapted to change out upon substantially complete utilization of said fluid;
   at least one second reservoir for containing said fluid;
   a first conduit for transferring said fluid over time from said at least one first reservoir to said at least one second reservoir, said first conduit being metallic and having a first end in communication with said at least one first reservoir and a second end in communication with said at least one second reservoir, wherein said fluid being transferred from said at least one first reservoir to said at least one second reservoir flows through said first conduit from said first end to said second end;
   a first fluid sensor adjacent said first conduit, said first fluid sensor adapted to detect a presence of said fluid in said first conduit and to detect an absence of said fluid in said first conduit, wherein said first fluid sensor generates at least one first signal indicative of the presence of said fluid or the absence of said fluid; and
   a controller for receiving said at least one first signal, said controller being adapted to identify an empty condition in said at least one first reservoir upon receiving at least one first signal indicative of the absence of said fluid in said first conduit or upon not receiving at least one first signal indicative of the presence of said fluid in said first conduit.

2. A chemical delivery system as in claim 1, further comprising means for removing at least a portion of said fluid from said at least one second reservoir.

3. A chemical delivery system as in claim 1 wherein said first fluid sensor is adjacent said first end of said first conduit.

4. A chemical delivery system as in claim 1 wherein said fluid is a liquid chemical having at least a high purity.

5. A chemical delivery system as in claim 1 wherein said first fluid sensor is an ultrasonic fluid sensor.

6. A chemical delivery system as in claim 4, further comprising:
   means for pressurizing with a gas a first headspace above said liquid chemical within said at least one first reservoir; and
   means for pressurizing with said gas a second headspace above said liquid chemical within said at least one second reservoir.

7. A chemical delivery system as in claim 6, wherein said gas is selected from the group consisting of helium, nitrogen, oxygen, hydrogen and argon.

8. A chemical delivery system as in claim 4, wherein said liquid chemical is selected from the group consisting of tetraethylorthosilicate, borazine, aluminum trisec-butoxide, carbon tetrachloride, trichloroethanes, chloroform, trimethylphosphite, dichloroethylenes, trimethylborate, dichloromethane, titanium n-butoxide, diethylsilane, hexafluoroacetylacetonato-copper(1)trimethylvinylsilane, isopropoxide, triethylphoshate, silicon tetrachloride, tantalum ethoxide, tetrakis(diethylamido)titanium, tetrakis (dimethylamido)titanium, bis-tertiarybutylamido silane, triethylborate, titanium tetrachloride, trimethylphosphate, trimethylorthosilicate, titanium ethoxide, tetramethyl-cyclotetrasiloxane, titanium n-propoxide, tris(trimethylsiloxy) boron, titanium isobutoxide, tris(trimethylsilyl)phosphate, 1,1,1,5,5,5-hexafluoro-2,4-pentanedione, tetramethylsilane and mixtures thereof.

9. A chemical delivery system as in claim 6, further comprising a vent for venting said gas from at least one of said first headspace and said second headspace.

10. A chemical delivery system as in claim 1, wherein the controller is a microcomputer.

11. A chemical delivery system for delivering liquid chemicals having at least a high purity, comprising:
    at least one first reservoir for containing said liquid chemical;
    at least one second reservoir for containing said liquid chemical;
    means for pressurizing with a gas a first headspace above said liquid chemical within said at least one first reservoir;
    means for pressurizing with said gas a second headspace above said liquid chemical within said at least one second reservoir;
    a first conduit for transferring said liquid chemical over time from said at least one first reservoir to said at least one second reservoir, said first conduit being metallic and having a first end in communication with said at least one first reservoir and a second end in communication with said at least one second reservoir, wherein said liquid chemical being transferred from said at least one first reservoir to said at least one second reservoir flows through said first conduit from said first end to said second end;
    a first fluid sensor adjacent said first conduit, said first fluid sensor adapted to detect a presence of said liquid chemical in said first conduit and to detect an absence of said liquid chemical in said first conduit, wherein said first fluid sensor generates at least one first signal indicative of the presence of said liquid chemical or the absence of said liquid chemical; and
    a controller for receiving said at least one first signal, said controller being adapted to identify an empty condition in said at least one first reservoir upon receiving at least one first signal indicative of the absence of said liquid chemical in said first conduit or upon not receiving at least one first signal indicative of the presence of said liquid chemical in said first conduit,
    a vent for venting said gas from at least one of said first headspace and said said second headspace, wherein said vent comprises:
       a second conduit for exhausting at least a portion of said gas being vented; and
       a second fluid sensor adapted to detect a presence of said liquid chemical in said second conduit, wherein said second fluid sensor generates at least one second signal indicative of said presence of said liquid chemical in said second conduit.

12. A chemical delivery system as in claim 11, wherein said controller receives said at least one second signal, said controller being adapted to identify an overflow of said liquid chemical from at least one of said at least one first reservoir and said at least one second reservoir upon receiving said at least one second signal.

13. A chemical delivery system as in claim 11, further comprising a source of vacuum for evacuating at least a portion of any chemicals in at least one of said first and second conduit.

14. A chemical delivery system as in claim 13, wherein said source of vacuum comprises:
   a third conduit for exhausting said non-liquids; and
   a third fluid sensor adapted to detect a presence of said liquid chemical in said third conduit, wherein said third fluid sensor generates at least one third signal indicative of said presence of said liquid chemical in said third conduit.

15. A chemical delivery system as in claim 14, wherein said controller receives said at least one third signal, said controller being adapted to identify a malfunction in said chemical delivery system upon receiving said at least one third signal.

16. A method of detecting an occurrence of an empty condition in a reservoir containing a liquid, said liquid having at least a high-purity and flowing over time from said reservoir through a metallic conduit in communication with said reservoir, said reservoir having a headspace pressurized by a has above said liquid, comprising the steps of:
   (a) providing a fluid sensor adjacent said metallic conduit, said fluid sensor adapted to detect a presence of said liquid in said metallic conduit and to transmit at least one first signal indicative thereof, said fluid sensor also adapted to detect a presence of said gas in said metallic conduit and to transmit at least one another signal indicative thereof;
   (b) detecting with said fluid sensor a presence of said liquid in said metallic conduit, said fluid sensor transmitting said at least one first signal; and
   (c) identifying with said fluid sensor a subsequent absence of said liquid in said metallic conduit.

17. A method as in claim 16, wherein said fluid sensor is an ultrasonic fluid sensor.

18. A method as in claim 16, comprising the further steps of:
   (d) waiting a predetermined period of time after identifying said subsequent absence of said liquid;
   (e) sensing with said fluid sensor a subsequent presence of a fluid in said metallic conduit;
   (f) determining with said fluid sensor whether said fluid is said liquid or said gas;
   (g) repeating steps (b) through (f) if said fluid is determined to be said liquid; and
   (h) transmitting at least one another signal from said fluid sensor if said fluid is determined to be said gas, said another signal indicating an occurrence of an empty condition in the reservoir.

19. A method as in claim 18, wherein said predetermined period of time is about two (2) seconds.

20. A method as in claim 16, wherein the step of (c) identifying with said fluid sensor a subsequent absence of said liquid in said metallic conduit comprises the sub-steps of:
   (i) receiving said at least one first signal from said fluid sensor; and
   (ii) identifying a subsequent absence of said at least one first signal from said fluid sensor.

21. A chemical delivery system for delivering a liquid chemical having at least a high purity, comprising:
   at least one first reservoir for containing said liquid chemical;
   at least one second reservoir for containing said liquid chemical;
   a first conduit for transferring said liquid chemical over time from said at least one first reservoir to said at least one second reservoir, said first conduit being metallic and having a first end in communication with said at least one first reservoir and a second end in communication with said at least one second reservoir, wherein said liquid chemical being transferred from said at least one first reservoir to said at least one second reservoir flows through said first conduit from said first end to said second end;
   a first ultrasonic fluid sensor adjacent said first conduit, said first ultrasonic fluid sensor adapted to detect a presence of said liquid chemical and to detect an absence of said liquid chemical, wherein said first ultrasonic fluid sensor generates at least one first signal indicative of the presence of said liquid chemical or the absence of said liquid chemical;
   means for removing at least a portion of said liquid chemical from said at least one second reservoir;
   means for pressurizing with a gas a first headspace above said liquid chemical within said at least one first reservoir;
   means for pressurizing with a gas a second headspace above said liquid chemical within said at least one second reservoir;
   a second conduit for venting at least a portion of said gas from at least one of said first headspace and said second headspace;
   a second ultrasonic fluid sensor adapted to detect a presence of said liquid chemical in said second conduit, wherein said second ultrasonic fluid sensor generates at least one second signal indicative of said presence of said liquid chemical in said second conduit;
   a third conduit for evacuating at least a portion of any non-liquids in at least one of said at least one first reservoir and said at least one second reservoir;
   a third ultrasonic fluid sensor adapted to detect a presence of said liquid chemical in said third conduit, wherein said third ultrasonic fluid sensor generates at least one third signal indicative of said presence of said liquid chemical in said third conduit; and
   a controller for receiving said at least one first signal, said controller being adapted to identify an empty condition in said at least one first reservoir upon receiving at least one first signal indicative of the absence of said liquid chemical in said first conduit or upon not receiving at least one first signal indicative of the presence of said liquid chemical in said first conduit, and wherein said controller receives said at least one second signal, said controller being adapted to identify an overflow of said liquid chemical from at least one of said at least one first reservoir and said at least one second reservoir upon receiving said at least one second signal, and further wherein said controller receives said at least one third signal, said controller being adapted to identify a malfunction in said chemical delivery system upon receiving said at least one third signal.

22. A chemical delivery system as in claim 21, wherein said chemical delivery system is shut down when said controller identifies any one of the following:
   (a) an overflow of said liquid chemical from at least one of said at least one first reservoir and at least one second reservoir; and
   (b) a malfunction in said chemical delivery system.

* * * * *

UNITED STATES PATENT AND TRADEMARK OFFICE
CERTIFICATE OF CORRECTION

PATENT NO.    : 6,264,064 B1
DATED         : July 24, 2001
INVENTOR(S)   : Charles Michael Birtcher It is certified that error appears in the above-identified patent and that said Letters Patent is hereby corrected as shown below:

Column 15,
Line 26, cancel "has" and insert -- gas -- above.

Signed and Sealed this

Seventh Day of May, 2002

Attest:

Attesting Officer

JAMES E. ROGAN
Director of the United States Patent and Trademark Office